(12) United States Patent
Hubahib Gaviola et al.

(10) Patent No.: US 10,617,034 B2
(45) Date of Patent: Apr. 7, 2020

(54) HEAT DISSIPATION SYSTEM OF ENCLOSED ELECTRONIC MODULE WITH SINGLE/MULTIPLE ACTIVE COMPONENTS

(71) Applicant: CLOUD LIGHT TECHNOLOGY LIMITED, Hong Kong (HK)

(72) Inventors: Gad Joseph Hubahib Gaviola, Hong Kong (HK); Vincent Wai Hung, Hong Kong (HK); Margarito P. Banal, Jr., Hong Kong (HK); Vivian Wei Ma, Hong Kong (HK)

(73) Assignee: CLOUD LIGHT TECHNOLOGY LIMITED, Hong Kong (HK)

( * ) Notice: Subject to any disclaimer, the term of this patent is extended or adjusted under 35 U.S.C. 154(b) by 0 days.

(21) Appl. No.: 15/838,409

(22) Filed: Dec. 12, 2017

(65) Prior Publication Data
US 2019/0182985 A1    Jun. 13, 2019

(51) Int. Cl.
    H05K 7/20    (2006.01)
    H05K 5/00    (2006.01)
    H05K 1/02    (2006.01)
    H05K 1/18    (2006.01)

(52) U.S. Cl.
    CPC ....... *H05K 7/20409* (2013.01); *H05K 1/0203* (2013.01); *H05K 1/181* (2013.01); *H05K 5/0004* (2013.01); *H05K 7/20336* (2013.01); *H05K 2201/10522* (2013.01)

(58) Field of Classification Search
    CPC .............. H05K 5/0004; H05K 1/0203; H05K 7/20336; H05K 7/20409

USPC ......................................................... 361/700
    See application file for complete search history.

(56) References Cited

U.S. PATENT DOCUMENTS

| | | | | |
|---|---|---|---|---|
| 5,105,259 A | * | 4/1992 | McShane | H01L 21/565 257/667 |
| 6,065,530 A | * | 5/2000 | Austin | H05K 7/2039 165/185 |
| 6,374,912 B1 | * | 4/2002 | LaGrotta | H05K 5/061 165/185 |
| 6,816,376 B2 | * | 11/2004 | Bright | G02B 6/4201 361/704 |
| 7,710,734 B2 | * | 5/2010 | Ice | G02B 6/4201 361/702 |
| 7,764,504 B2 | * | 7/2010 | Phillips | G02B 6/4246 165/80.2 |
| 7,859,849 B2 | * | 12/2010 | Ice | H05K 7/20418 361/704 |
| 7,898,808 B2 | * | 3/2011 | Joiner | H05K 7/20445 361/704 |
| 7,974,098 B2 | * | 7/2011 | Oki | G02B 6/4201 165/185 |

(Continued)

*Primary Examiner* — Anatoly Vortman

(57) ABSTRACT

The present disclosure relates to an enclosed electronic module with single/multiple active components and an integrated heat dissipation system, including a top housing formed with one or more openings, a heat sink mounted on an outer surface of the top housing over the opening(s) thereof, a bottom housing coupled with the top housing, one or more active components mounted on a PCB between the top and bottom housings, and at least one thermal block or vapor chamber thermally connected between the heat sink and the active component(s), thereby forming one or more thermal dissipation paths extending from the active component(s), through the at least one thermal block or vapor chamber, and to the heat sink.

22 Claims, 18 Drawing Sheets

(56) References Cited

U.S. PATENT DOCUMENTS

| | | | | |
|---|---|---|---|---|
| 8,035,973 B2* | 10/2011 | McColloch | G02B 6/4246 | 361/704 |
| 9,389,368 B1* | 7/2016 | Sharf | H01R 27/00 | |
| 9,936,580 B1* | 4/2018 | Vinciarelli | B23K 1/0016 | |
| 9,992,912 B1* | 6/2018 | Wang | H05K 7/20409 | |
| 2001/0045644 A1* | 11/2001 | Huang | H01L 23/4334 | 257/718 |
| 2004/0027816 A1* | 2/2004 | Ice | G02B 6/4201 | 361/797 |
| 2004/0218362 A1* | 11/2004 | Amaro | G06F 1/20 | 361/697 |
| 2004/0222517 A1* | 11/2004 | Robertson | H01L 23/4093 | 257/718 |
| 2005/0190540 A1* | 9/2005 | Shearman | H05K 7/1461 | 361/715 |
| 2005/0195565 A1* | 9/2005 | Bright | H04B 1/036 | 361/688 |
| 2006/0186551 A1* | 8/2006 | Lange | H01L 23/3107 | 257/778 |
| 2006/0291171 A1* | 12/2006 | Ahrens | G02B 6/4292 | 361/716 |
| 2007/0211441 A1* | 9/2007 | Wang | H05K 5/0008 | 361/752 |
| 2007/0236883 A1* | 10/2007 | Ruiz | H01L 23/473 | 361/699 |
| 2009/0103267 A1* | 4/2009 | Wieland | H05K 7/20409 | 361/707 |
| 2009/0223647 A1* | 9/2009 | Alousi | F28D 15/0233 | 165/80.3 |
| 2009/0268394 A1* | 10/2009 | Cheng | G06F 1/20 | 361/679.54 |
| 2010/0039771 A1* | 2/2010 | Marchand | H05K 7/20909 | 361/694 |
| 2013/0328466 A1* | 12/2013 | Chang | G06F 1/181 | 312/236 |
| 2014/0160679 A1* | 6/2014 | Kelty | H05K 7/20672 | 361/700 |
| 2014/0216703 A1* | 8/2014 | Yi | H01L 23/367 | 165/185 |
| 2014/0240922 A1* | 8/2014 | Watanabe | H05K 7/20409 | 361/679.54 |
| 2015/0342085 A1* | 11/2015 | McKervey | H05K 7/20009 | 165/80.3 |
| 2017/0077587 A1* | 3/2017 | Fleancu | H05K 7/20409 | |
| 2017/0164459 A1* | 6/2017 | Kim | H05K 1/0203 | |
| 2017/0295640 A1* | 10/2017 | Tsunoda | H05K 9/0024 | |
| 2018/0042101 A1* | 2/2018 | Avalos | B29C 45/0046 | |
| 2018/0143671 A1* | 5/2018 | Lee | G11B 33/1406 | |
| 2018/0157297 A1* | 6/2018 | Delano | G06F 1/206 | |

* cited by examiner

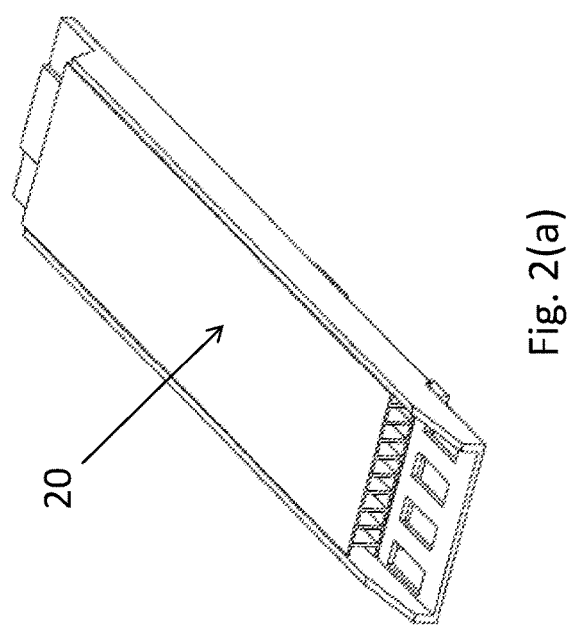
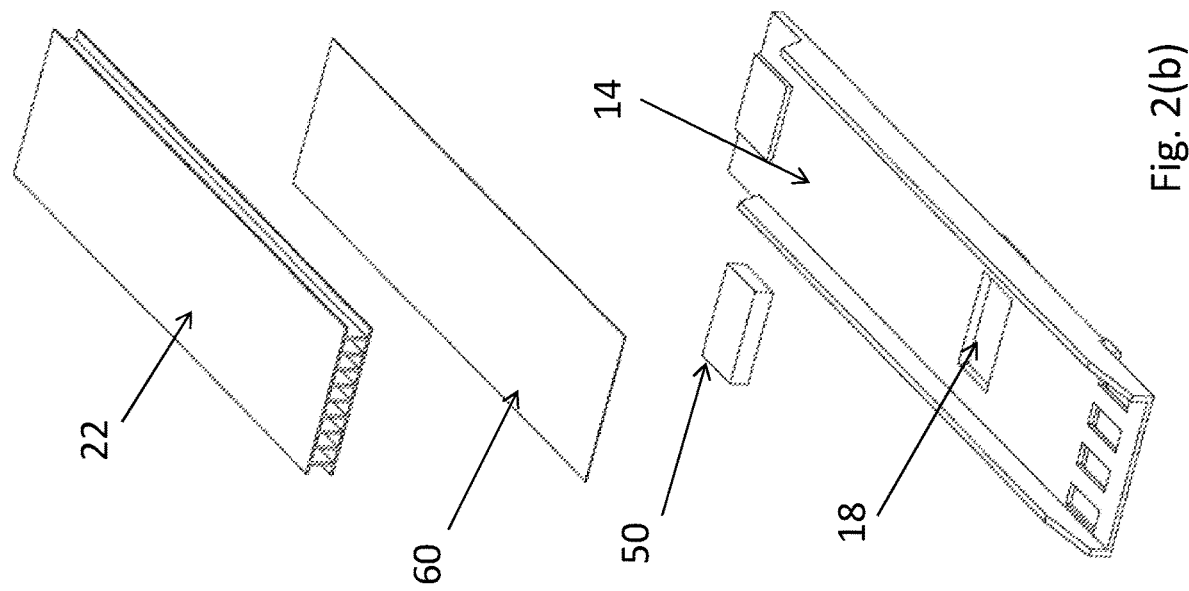
Fig. 2(a)
Fig. 2(b)

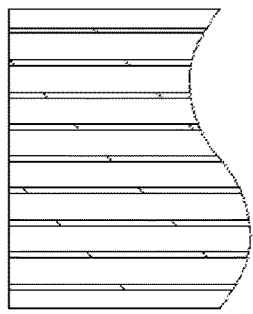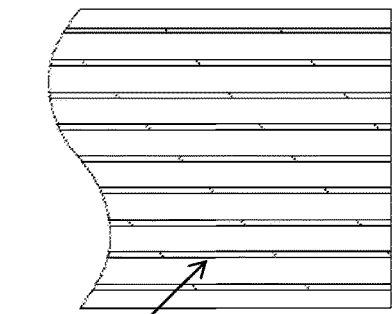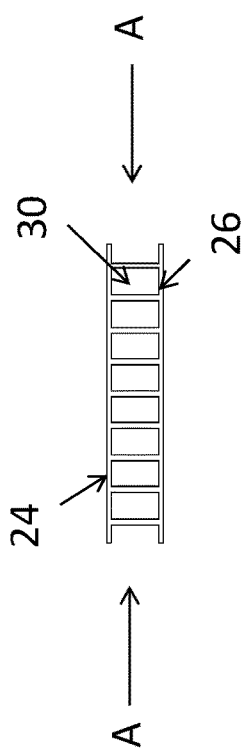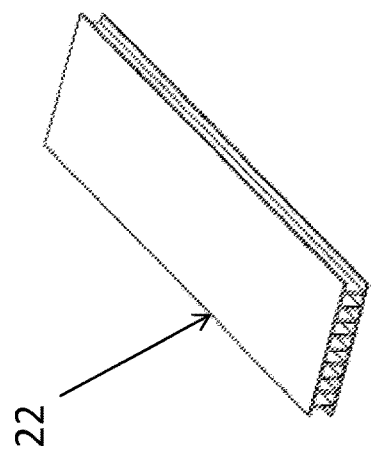

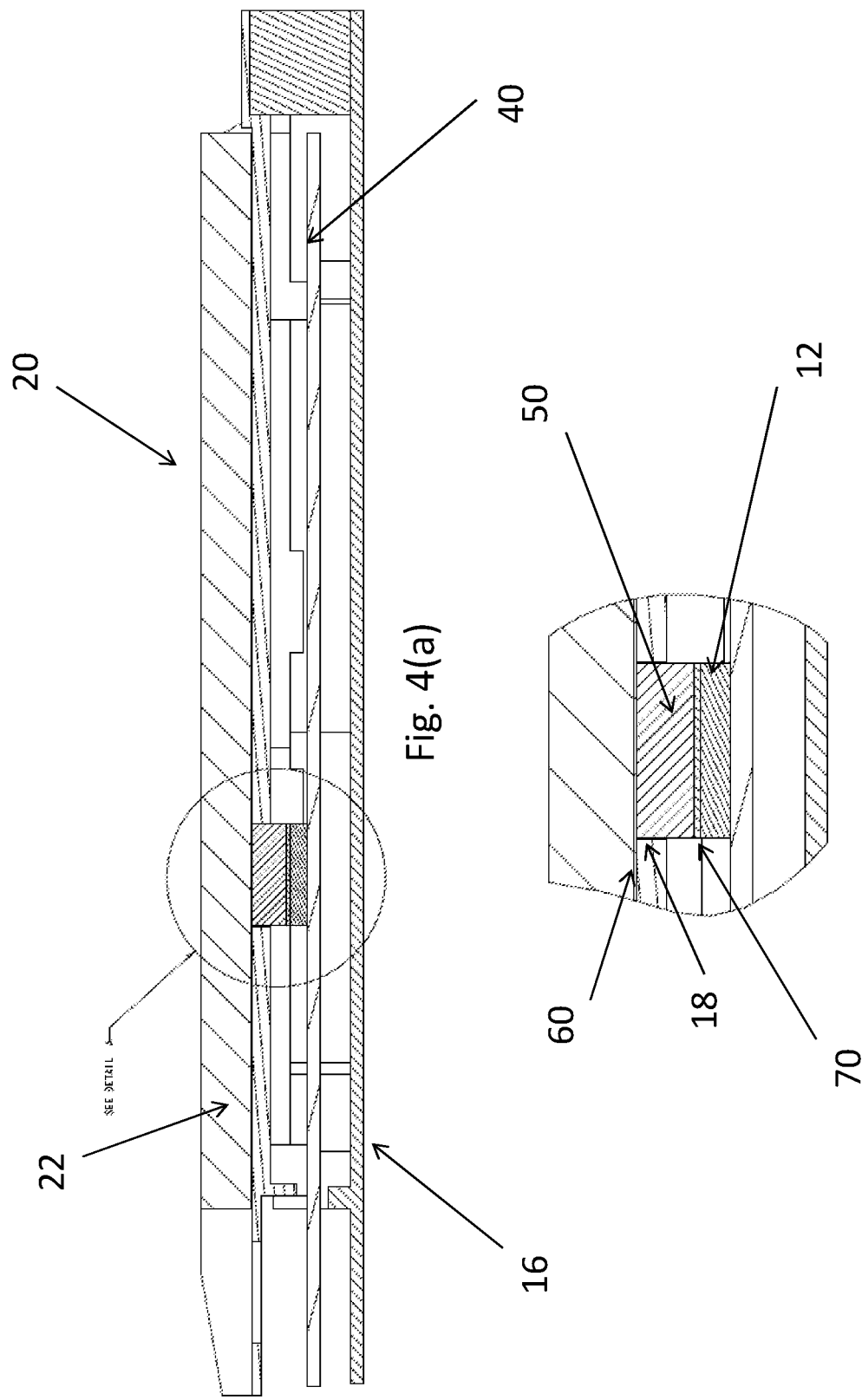

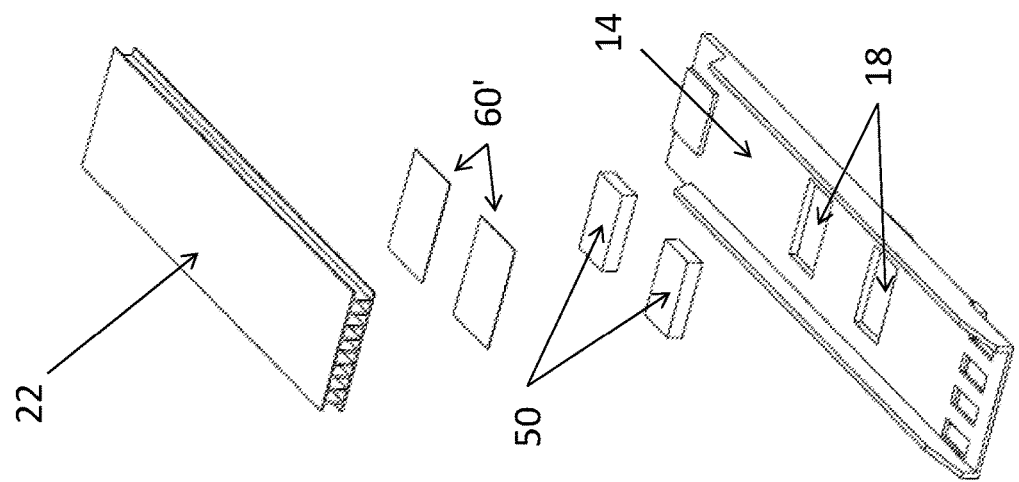
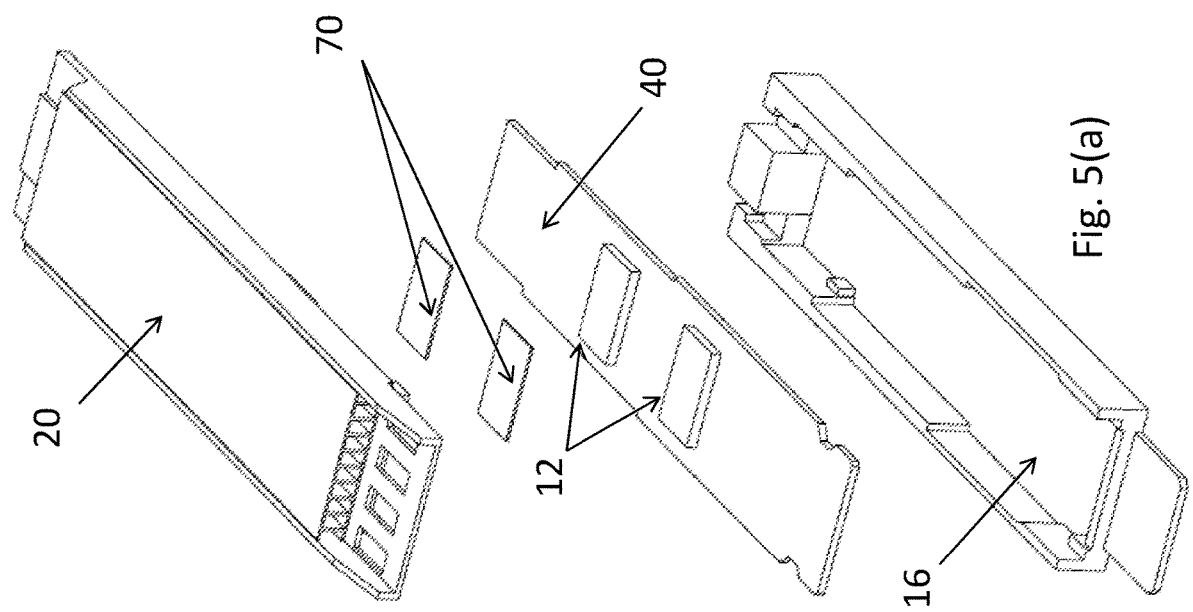

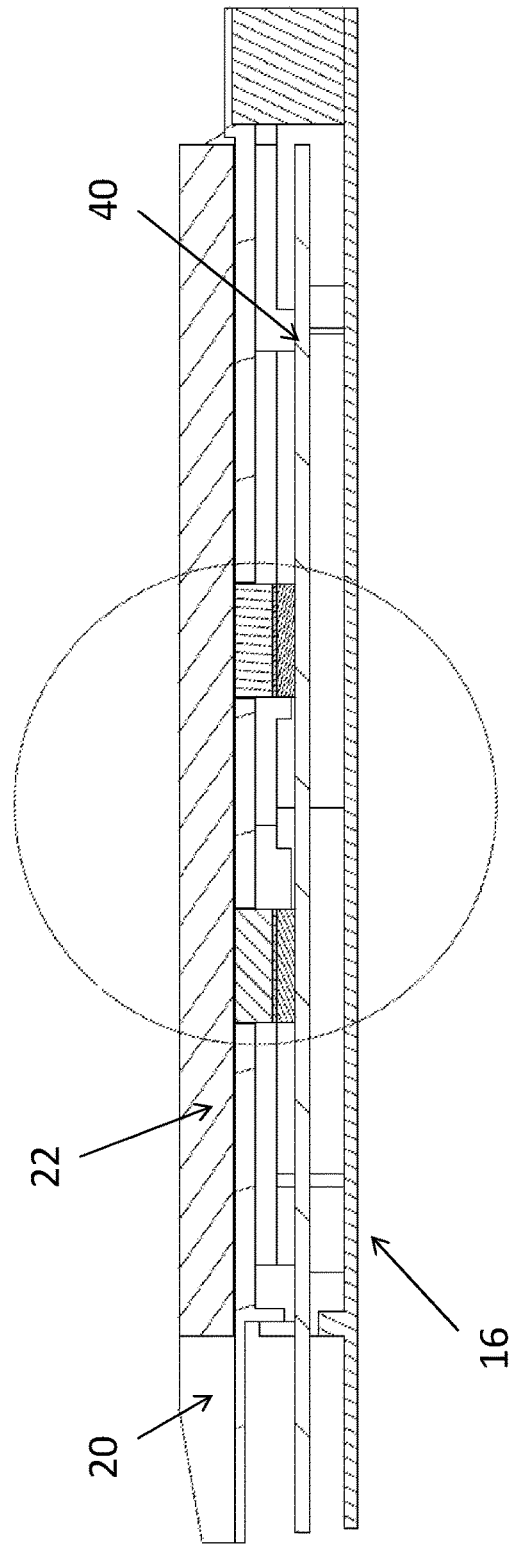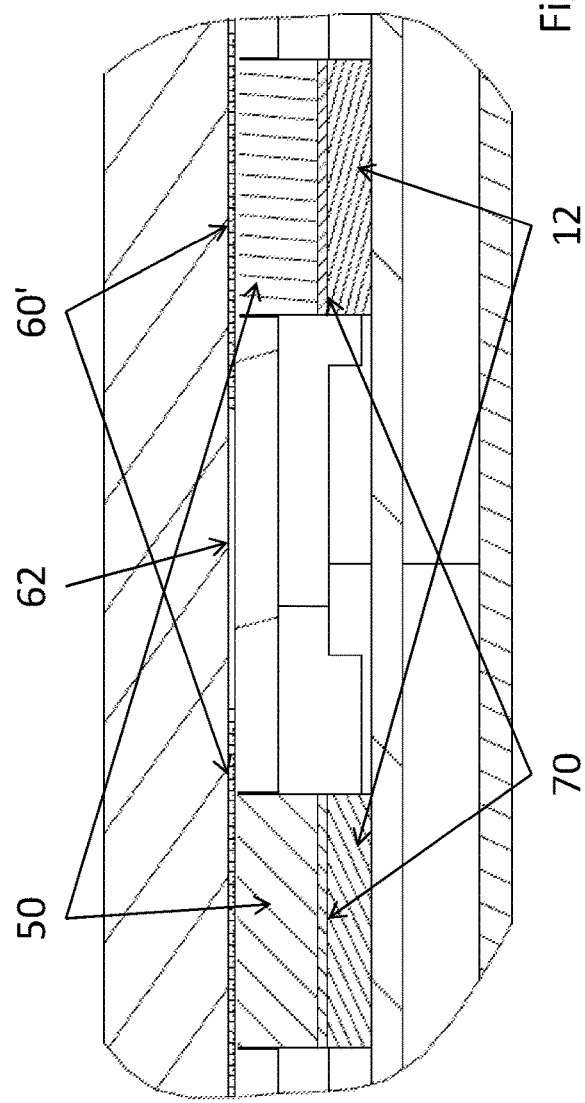

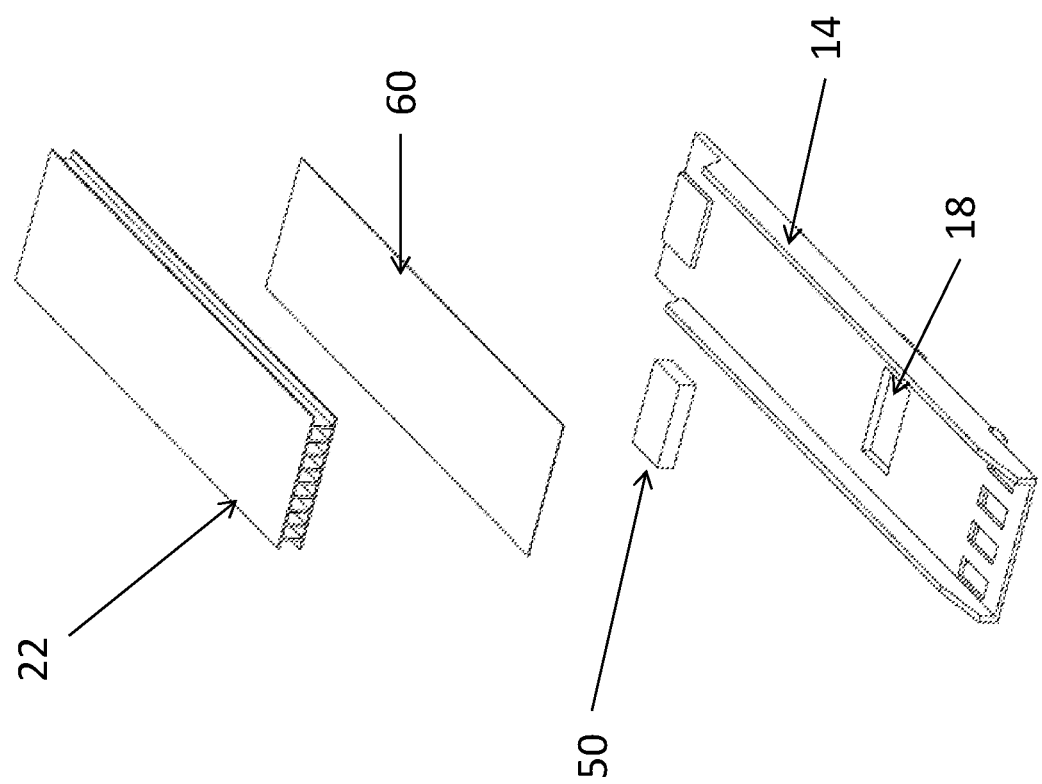

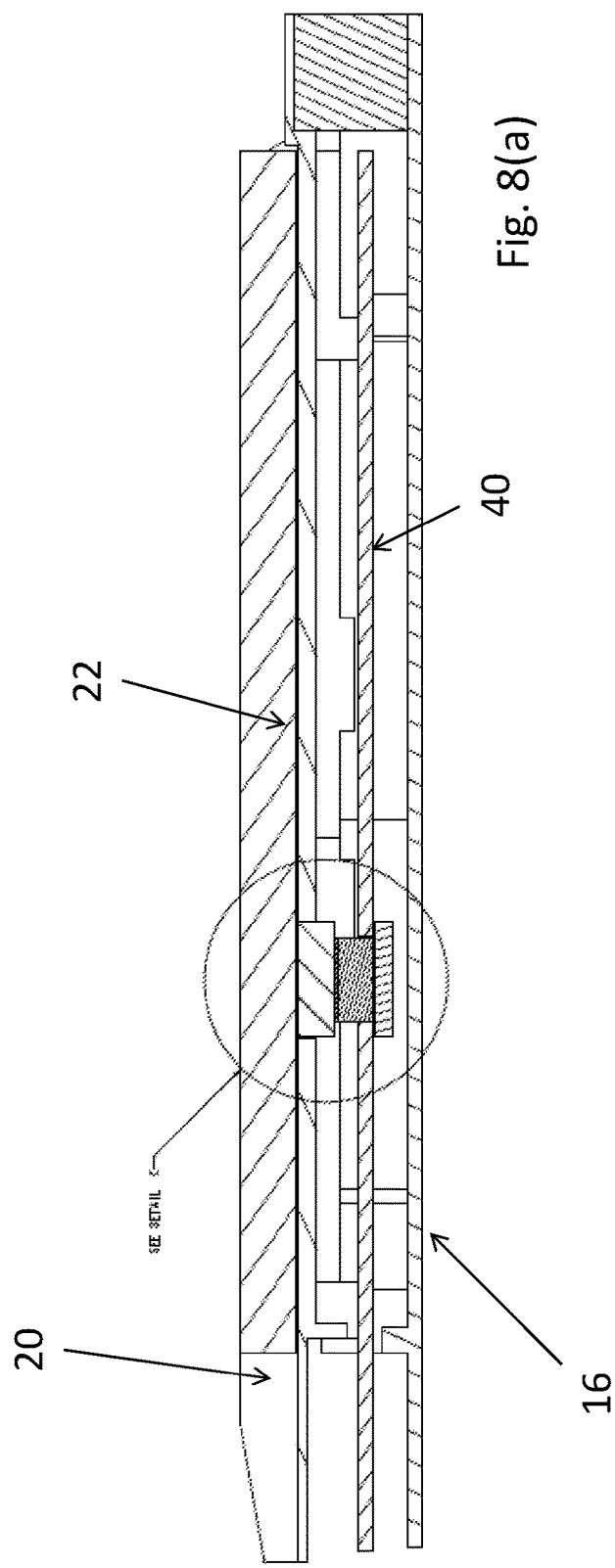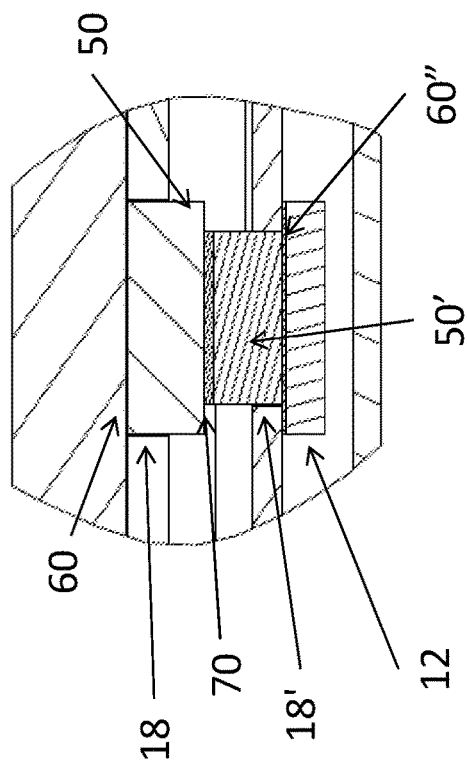

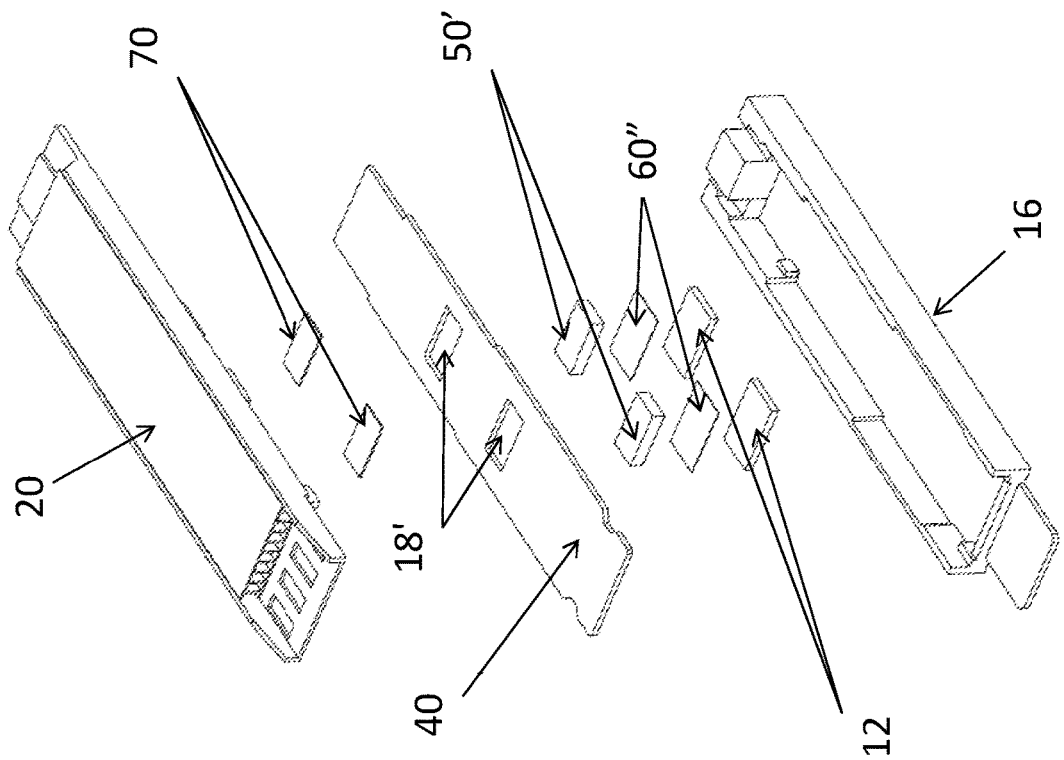
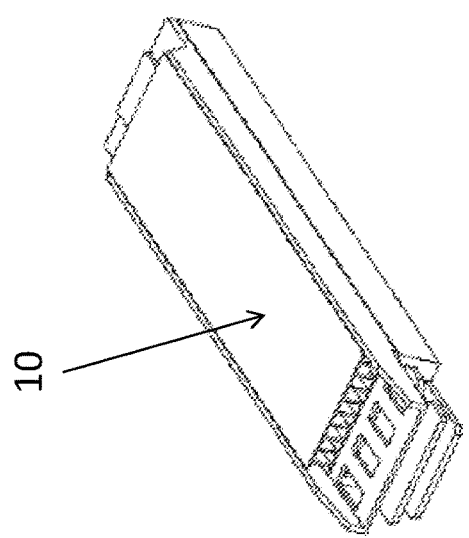
Fig. 9(a)
Fig. 9(b)

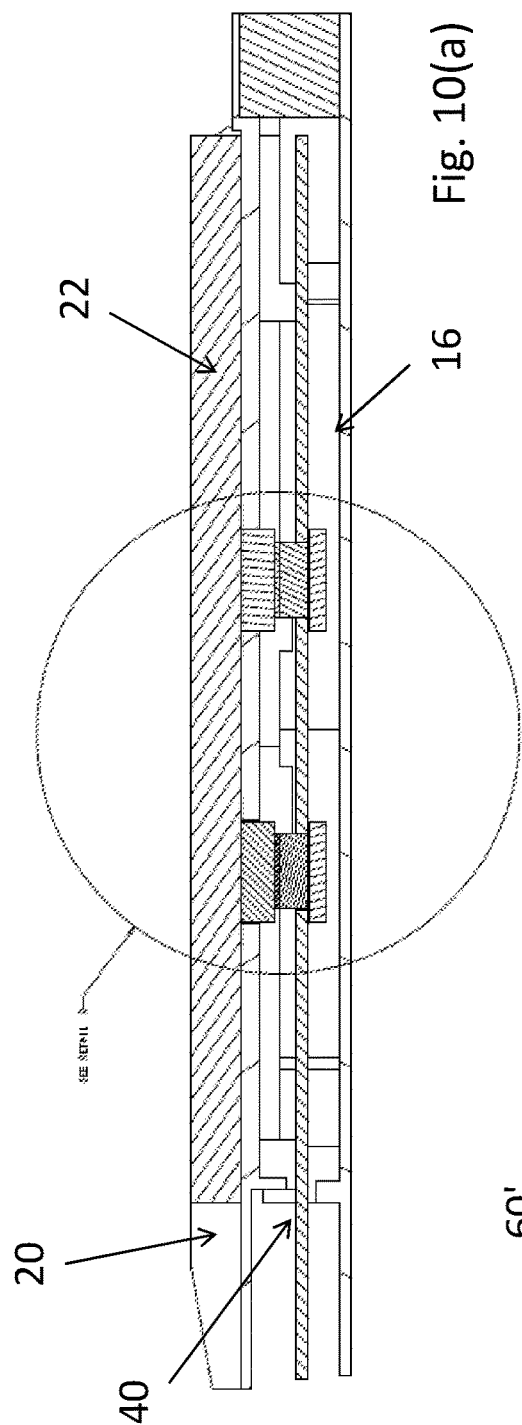
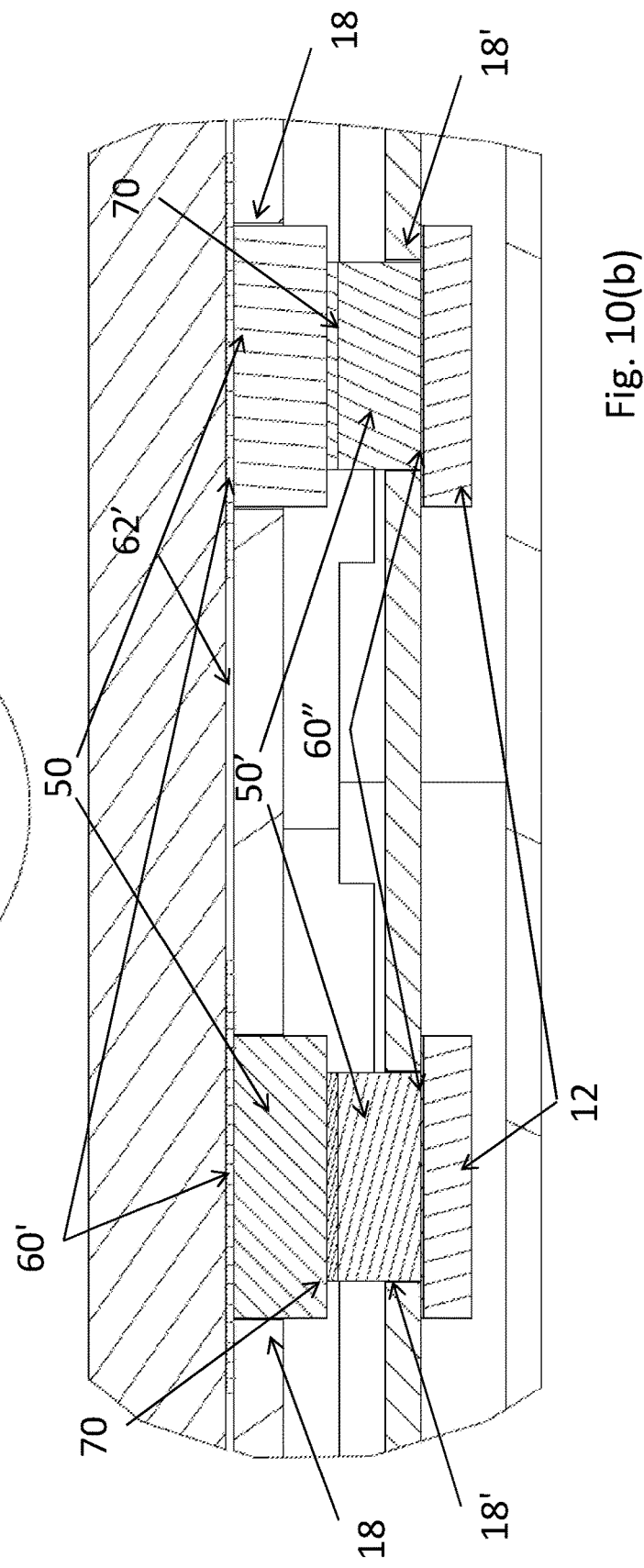
Fig. 10(a)
Fig. 10(b)

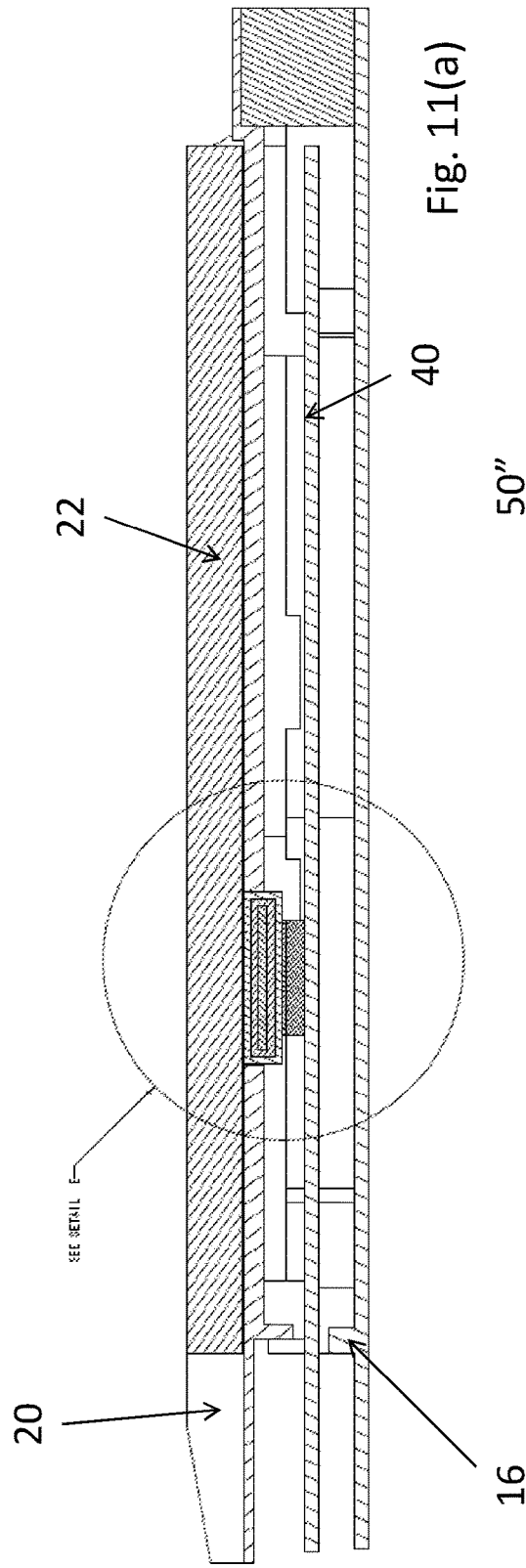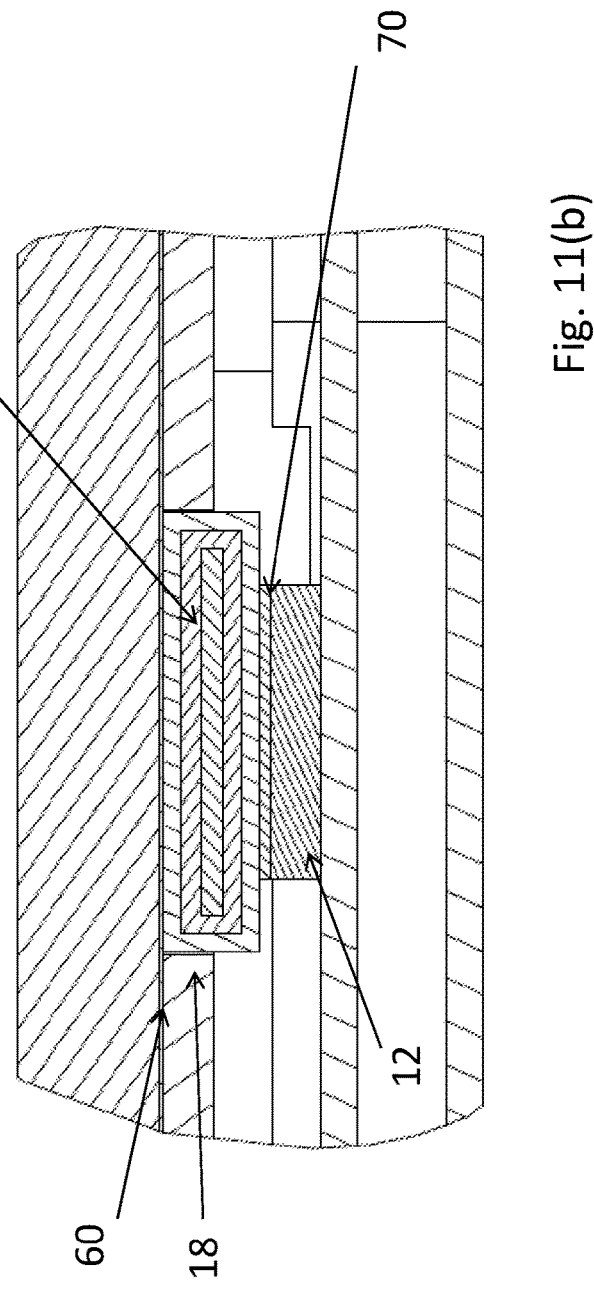

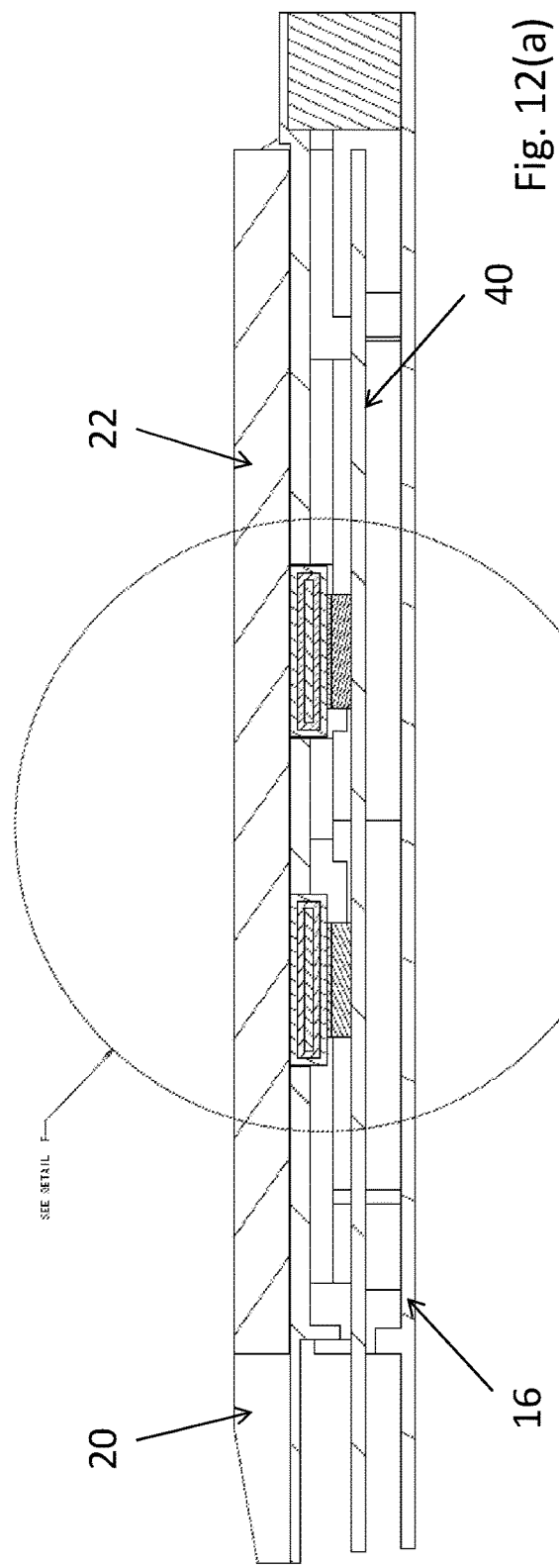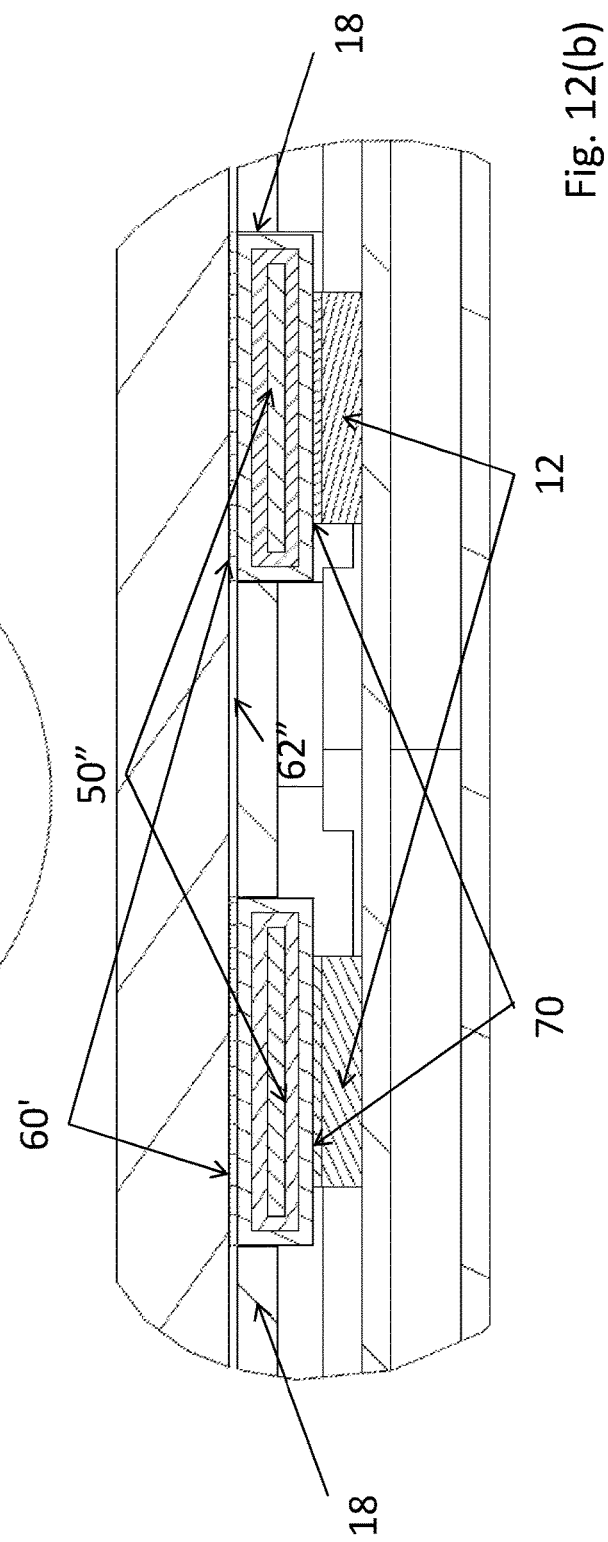

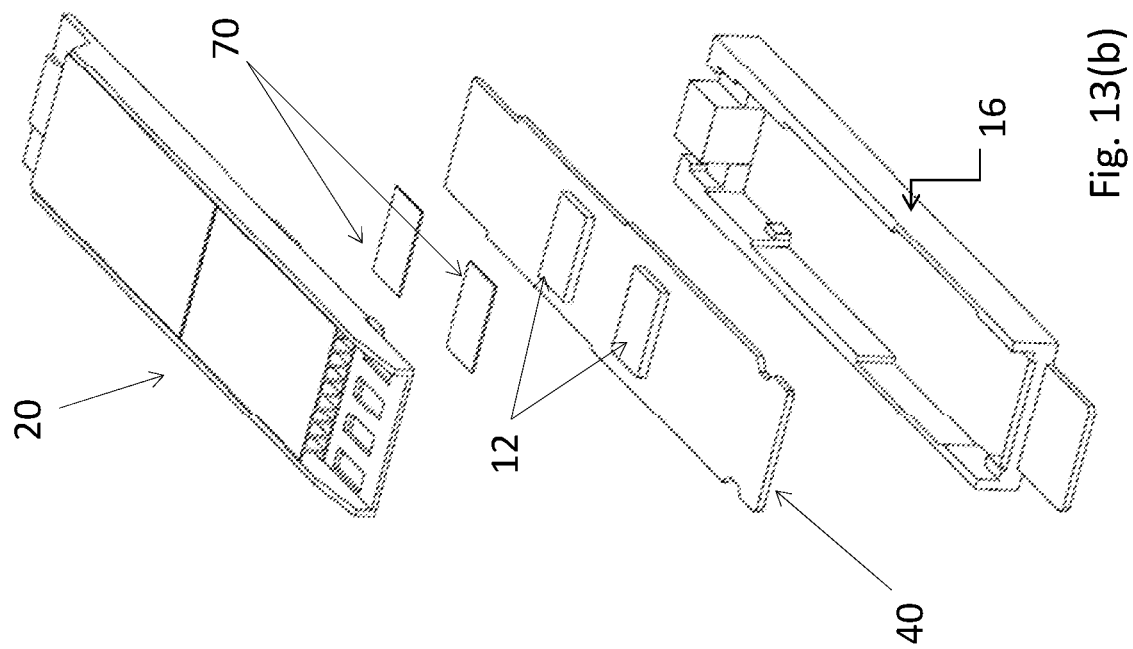
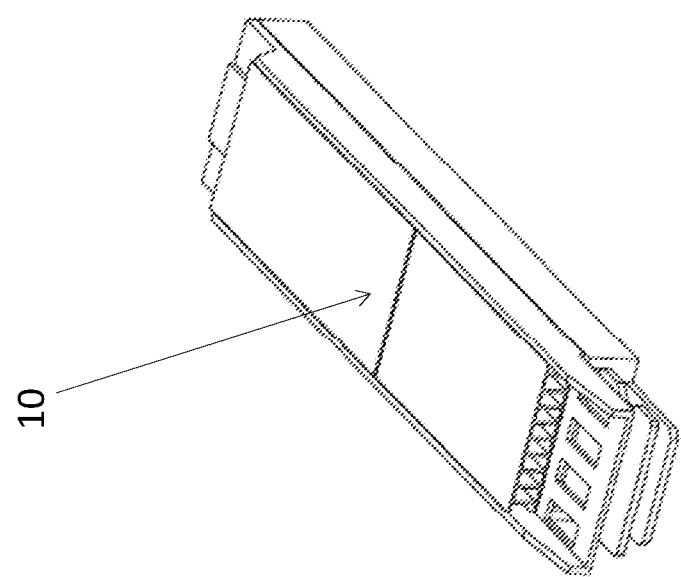
Fig. 13(a)
Fig. 13(b)

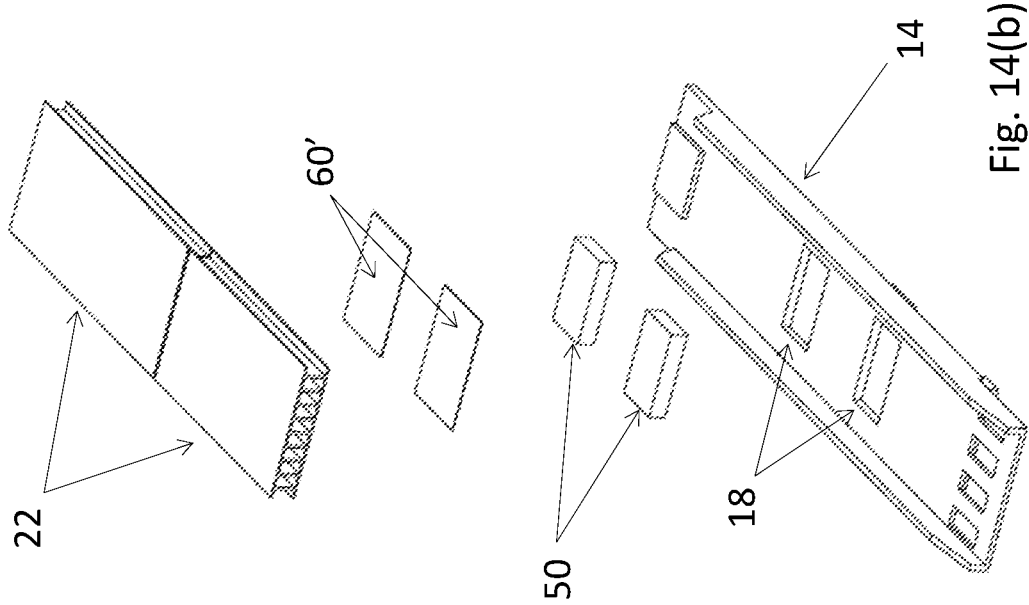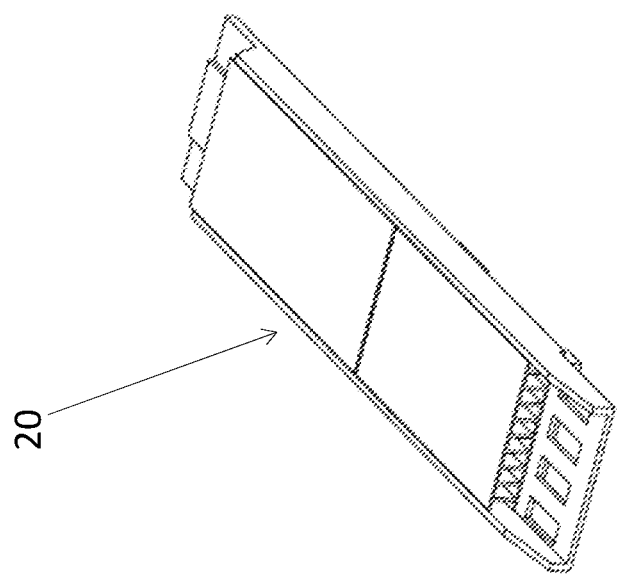
Fig. 14(b)
Fig. 14(a)

HEAT DISSIPATION SYSTEM OF ENCLOSED ELECTRONIC MODULE WITH SINGLE/MULTIPLE ACTIVE COMPONENTS

TECHNICAL FIELD

The present disclosure relates to a heat dissipation system of an enclosed electronic module with single/multiple active components, and in particular to a heat dissipation system integrated into a housing of an optical transceiver.

BACKGROUND

Many electronic devices, such as control modules, power modules and connectors, etc. are modules with enclosed housings. The housings can keep the modules' integrity and provide mechanical protection. These electronic modules usually have single/multiple active components which generate heat during operation. Heat dissipation solution in such kind of enclosed modules is important in order to ensure good functionality of the devices.

Optical transceiver, as one kind of the enclosed modules, is an electro-optical convertor and connector. Being a format either as a transmitter or a receiver, or an integrated optical transceiver, it normally includes an opto-electronic light source, such as a laser, and opto-electronic light receiver, such as a photodiode, corresponding electro-optical IC driver and opto-electronic IC signal processing and amplifier, electronic circuitry with various other components and a metal housing accommodating all the components. In the enclosed metal housing, laser is the major heat source, and several active components also generate heat. The heat needs to be dissipated from the enclosed housing to avoid overheating of these various components. With the continuously increased transmission speed of the transceivers and the density of the interconnection system, more heat is generated by these components and further accumulated in the system. Dissipating the heat to the outside as fast as possible to avoid overheating becomes a big challenge.

The above description of the background is provided to aid in understanding a heat dissipation system of an enclosed electronic module with single/multiple active components, but is not admitted to describe or constitute pertinent prior art to the heat dissipation system of an enclosed electronic module with single/multiple active components.

SUMMARY

According to aspect of the disclosure, there is provided an enclosed electronic module with single/multiple active components with an integrated heat dissipation system, including:
a top housing formed with at least one opening;
a heat sink mounted on an outer surface of the top housing over the opening thereof;
a bottom housing coupled with the top housing;
at least one active component mounted on a printed circuit board (PCB) mounted between the top and bottom housings; and
at least one thermal conductive device thermally connected between the heat sink and the active component, one portion of the at least one thermal conductive device being disposed in the opening of the top housing;
thereby forming a thermal dissipation path extending from the active component, along the at least one thermal conductive device, through the opening of the top housing and to the heat sink.

In a first embodiment, the at least one thermal conductive device includes a thermal block thermally connected between the heat sink and the active component mounted on an upper surface of the PCB facing the opening of the top housing.

In one embodiment, the enclosed electronic module with single/multiple active components and an integrated heat dissipation system further includes a solder pad sandwiched between the heat sink and the thermal block, and the solder pad is dimensioned to span in between an entire lower surface of the heat sink and the outer surface of the top housing.

In one embodiment, the enclosed electronic module with single/multiple active components and an integrated heat dissipation system further includes a thermal interface material sandwiched between the thermal block and the active component.

In a second embodiment, the top housing is formed with two openings, two active components are mounted on an upper surface of the PCB facing the two openings of the top housing respectively, and the at least one thermal conductive device includes two thermal blocks thermally connected between the heat sink and the two active components respectively.

In one embodiment, the enclosed electronic module with single/multiple active components and an integrated heat dissipation system further includes two solder pads sandwiched between the heat sink and the respective two thermal blocks, and a gap is formed between the two adjacent solder pads to prevent thermal interaction between the two adjacent active components.

In one embodiment, the enclosed electronic module with single/multiple active components and an integrated heat dissipation system further includes two thermal interface materials sandwiched between the corresponding two thermal blocks and the two active components respectively.

In a third embodiment, the PCB is formed with an additional opening aligned with the opening of the top housing, and the active component is mounted under the additional opening on a lower surface of the PCB facing the bottom housing, and wherein the at least one thermal conductive device includes a group of upper and lower thermal blocks thermally connected between the heat sink and the active component, the upper thermal block being disposed within the opening of the top housing, and the lower thermal block being disposed within the additional opening of the PCB.

In one embodiment, the enclosed electronic module with single/multiple active components and an integrated heat dissipation system further includes an upper solder pad sandwiched between the heat sink and the upper thermal block, the upper solder pad being dimensioned to span in between an entire lower surface of the heat sink and the outer surface of the top housing; and a lower solder pad sandwiched between the lower thermal block and the active component.

In one embodiment, the enclosed electronic module with single/multiple active components and an integrated heat dissipation system further includes a thermal interface material sandwiched between the upper and lower thermal blocks.

In a fourth embodiment, the top housing is formed with two openings, the PCB is formed with two additional openings aligned with the two openings of the top housing, and two active components are mounted respectively under the two additional openings on a lower surface of the PCB facing the bottom housing, and wherein the at least one thermal conductive device includes a first group of upper and lower thermal blocks thermally connected between the heat sink and one of the two active components, and a second group of upper and lower thermal blocks thermally connected between the heat sink and another one of the two active components, the two upper thermal blocks being disposed within the respective two openings of the top housing, and the two lower thermal blocks being disposed within the respective two additional openings of the PCB.

In one embodiment, the enclosed electronic module with single/multiple active components and an integrated heat dissipation system further includes two upper solder pads sandwiched between the heat sink and the respective two upper thermal blocks, a gap being formed between the two adjacent upper solder pads to prevent thermal interaction between the two adjacent active components; and two lower solder pads sandwiched between the two lower thermal blocks and the respective two active components.

In one embodiment, the enclosed electronic module with single/multiple active components and an integrated heat dissipation system further includes two thermal interface materials sandwiched between the two upper thermal blocks and the respective two lower thermal blocks.

In a fifth embodiment, the at least one thermal conductive device includes a vapor chamber thermally connected between the heat sink and the active component mounted on an upper surface of the PCB facing the top housing.

In one embodiment, the enclosed electronic module with single/multiple active components and an integrated heat dissipation system further includes a solder pad sandwiched between the heat sink and the vapor chamber, the solder pad being dimensioned to span an entire lower surface of the heat sink and the outer surface of the top housing.

The enclosed electronic module with single/multiple active components and an integrated heat dissipation system as claimed in claim 14, further comprising a thermal interface material sandwiched between the vapor chamber and the active component.

In a sixth embodiment, the top housing is formed with two openings, and two active components are mounted on an upper surface of the PCB facing the respective two openings of the top housing, and wherein the at least one thermal conductive device comprises two vapor chambers thermally connected between the heat sink and the respective two active components.

In one embodiment, the enclosed electronic module with single/multiple active components and an integrated heat dissipation system further includes two solder pads sandwiched between the heat sink and the respective two vapor chambers, a gap being formed between the two adjacent solder pads to prevent thermal interaction between the two adjacent active components.

In one embodiment, the enclosed electronic module with single/multiple active components and an integrated heat dissipation system further includes two thermal interface materials sandwiched between the two vapor chambers and the two active components respectively.

In a seventh embodiment, the heat sink includes two heat sink portions separated by an additional gap to further prevent thermal interaction between the two adjacent active components.

In one embodiment, the heat sink includes a top metal sheet; a bottom metal sheet; and a plurality of slabs extending between the top and bottom sheets, and defining therein between a plurality of air flow channels to facilitate heat dissipation.

In one embodiment, the two active components are different active components that generate different amounts of heat, and the thermal blocks and the solder pads for the two different active components are made of different materials and have different thermal conductivities to prevent thermal interaction between the two active components.

Although the heat dissipation system of an enclosed electronic module with single/multiple active components is shown and described with respect to certain embodiments, it is obvious that equivalents and modifications will occur to others skilled in the art upon the reading and understanding of the specification. The heat dissipation system of an enclosed electronic module with single/multiple active components of the present disclosure includes all such equivalents and modifications, and is limited only by the scope of the claims.

BRIEF DESCRIPTION OF THE DRAWINGS

Specific embodiments of the heat dissipation system of an enclosed electronic module with single/multiple active components will now be described by way of example with reference to the accompanying drawings wherein:

FIG. 2(a) is a perspective view of a top housing assembly according to the first embodiment of the present disclosure.

FIG. 2(b) is an exploded view of the top housing assembly according to the first embodiment of the present disclosure.

FIG. 3(a) is a perspective view of a heat sink according to the first embodiment of the present disclosure.

FIG. 3(b) is a cross sectional view of the heat sink of FIG. 3(a).

FIG. 3(c) is a cross sectional view taken along line A-A of the heat sink of FIG. 3(b).

FIG. 4(a) is a longitudinal cross section of the enclosed electronic module according to the first embodiment of the present disclosure.

FIG. 4(b) is an enlarged view of the part of the enclosed electronic module in a circle shown in FIG. 4(a).

FIG. 5(a) is an exploded view of the enclosed electronic module according to a second embodiment of the present disclosure.

FIG. 5(b) is an exploded view of the top housing assembly according to the second embodiment of the present disclosure.

FIG. 6(a) is a longitudinal cross section of the enclosed electronic module according to the second embodiment of the present disclosure.

FIG. 6(b) is an enlarged view of the part of the enclosed electronic module in a circle shown in FIG. 6(a).

FIG. 7(c) is an exploded view of a top housing assembly according to the third embodiment of the present disclosure.

FIG. 8(a) is a longitudinal cross section of the enclosed electronic module according to the third embodiment of the present disclosure.

FIG. 8(b) is an enlarged view of the part of the enclosed electronic module in a circle shown in FIG. 8(a).

FIG. 9(a) is a perspective view of an enclosed electronic module according to a fourth embodiment of the present disclosure.

FIG. 9(b) is an exploded view of the enclosed electronic module according to the fourth embodiment of the present disclosure.

FIG. 10(a) is a longitudinal cross section of the enclosed electronic module according to the fourth embodiment of the present disclosure.

FIG. 10(b) is an enlarged view of the part of the enclosed electronic module in a circle shown in FIG. 10(a).

FIG. 11(a) is a longitudinal cross section of the enclosed electronic module according to a fifth embodiment of the present disclosure.

FIG. 11(b) is an enlarged view of the part of the enclosed electronic module in a circle shown in FIG. 11(a).

FIG. 12(a) is a longitudinal cross section of the enclosed electronic module according to a sixth embodiment of the present disclosure.

FIG. 12(b) is an enlarged view of the part of the enclosed electronic module in a circle shown in FIG. 12(a).

FIG. 13(a) is a perspective view of the enclosed electronic module according to a seventh embodiment of the present disclosure.

FIG. 13(b) is an exploded view of the enclosed electronic module according to the seventh embodiment of the present disclosure.

FIG. 14(a) is a perspective view of the top housing assembly according to the seventh embodiment of the present disclosure.

FIG. 14(b) is an exploded view of the top housing assembly according to the seventh embodiment of the present disclosure.

DETAILED DESCRIPTION

Figure 1A:
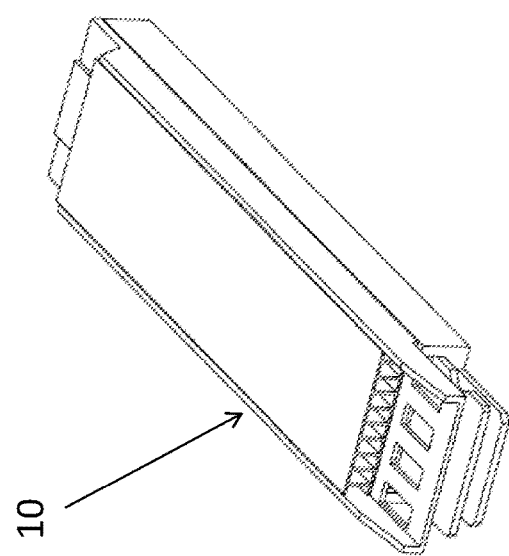
FIG. 1(a) is a perspective view of an enclosed electronic module according to a first embodiment of the present disclosure.

Reference will now be made in detail to a preferred embodiment of the heat dissipation system of an enclosed electronic module with single/multiple active components, examples of which are also provided in the following description. Exemplary embodiments of the heat dissipation system of an enclosed electronic module with single/multiple active components are described in detail, although it will be apparent to those skilled in the relevant art that some features that are not particularly important to an understanding of the heat dissipation system of an enclosed electronic module with single/multiple active components may not be shown for the sake of clarity.

For illustration purposes, the terms such as "upper", "lower", "top", "bottom", "over", or "under", etc. appeared hereinafter relate to the invention as it is oriented in the drawings. It is understood that the invention may assume various positions, except where expressly specified to the contrary. Furthermore, it is understood that the specific devices shown in the drawings, and described in the following description, are simply exemplary embodiments of the invention. Hence, specific dimensions and other physical characteristics related to the embodiments disclosed hereinafter are not to be considered as limiting.

It should be noted that throughout the specification and claims herein, when one element is said to be "coupled" or "connected" to another, this does not necessarily mean that one element is fastened, secured, or otherwise attached to another element. Instead, the term "coupled" or "connected" means that one element is either connected directly or indirectly to another element or is in mechanical or electrical communication with another element.

First Embodiment

Figure 1B:
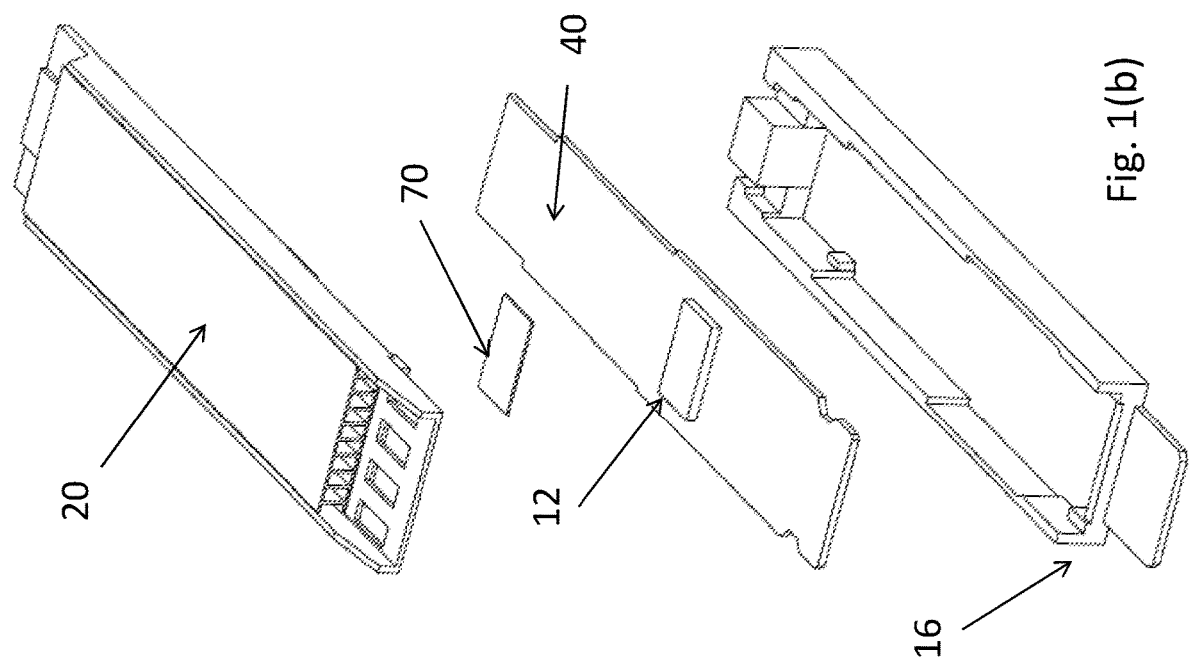
FIG. 1(b) is an exploded view of the enclosed electronic module according to the first embodiment of the present disclosure.

FIGS. 1(a) and 1(b) show different views of an enclosed electronic module according to a first embodiment of the present disclosure; and FIGS. 2(a) and 2(b) show different views of a top housing assembly according to the first embodiment of the present disclosure.

According to the illustrated embodiment, the enclosed electronic module 10 can be a QSFP/QSFP-DD (quad small form factor pluggable/quad small form factor pluggable-high density), OSFP (octal small form factor pluggable), or SFP/SFP-DD (small form factor pluggable/small form factor pluggable-high density) format optical transceiver module. The enclosed electronic module 10 may include a top housing 14 and a bottom housing 16. The top housing 14 can be coupled to the bottom housing 16 to form an enclosure. A printed circuit board (PCB) 40 may be mounted between the top and bottom housings 14, 16. At least one active component 12 may be mounted on the PCB 40. The active component 12 can be a heat source that can generate heat (e.g. 3 watts) during operation. To form the thermal dissipation structure for making the heat from source 12 to the outside of enclosed housing, the top housing 14 may be formed with at least one opening 18. A heat sink 22 may be provided on an outer surface of the top housing 14 over the opening 18 of the top housing 14. The heat sink 22 can be mounted on the top housing 14 to form a top housing assembly 20. Preferably, the active component 12 is disposed in a position generally in alignment with the opening 18 of the top housing 14. A thermal conductive device may be disposed through the opening 18 and thermally connected between the heat sink 22 and the active component 12. In the first embodiment, the thermal conductive device is a thermal block 50.

During manufacturing, the heat sink 22 can be attached on the thermal block 50 by a soldering process. Then, the heat sink 22 with the thermal block 50 can be soldered on the outer surface of the top housing 14 to form the top housing assembly 20. Since the thickness of the thermal block 50 is greater than the thickness of the top housing 14, an upper portion of the thermal block 50 is disposed in the opening 18, while a lower portion of the thermal block 50 is disposed outside the opening 18.

When the top housing 14 is connected to the bottom housing 16, the lower portion of the thermal block 50 is attachable to the active component 12. Since the thermal conductivity of the thermal block 50 (e.g. 387 W/m-K) is higher than the thermal conductivity of the top housing 14 (e.g. 109 W/m-K), the heat generated from the active component 12 can dissipate from an upper surface of the active component 12 to the thermal block 50, and spread into the heat sink 22. Air flow can bring the heat out to the surrounding when air passes through the air flow channels 30 of the heat sink 22.

It can be seen that an effective thermal dissipation path is established from the heat source, i.e. the active component 12 to the heat sink 22. In the illustrated embodiment, the thermal dissipation path extends from the active component 12, along the thermal block 50, through the opening 18 of the top housing 14 and to the heat sink 22.

Figure 3D:
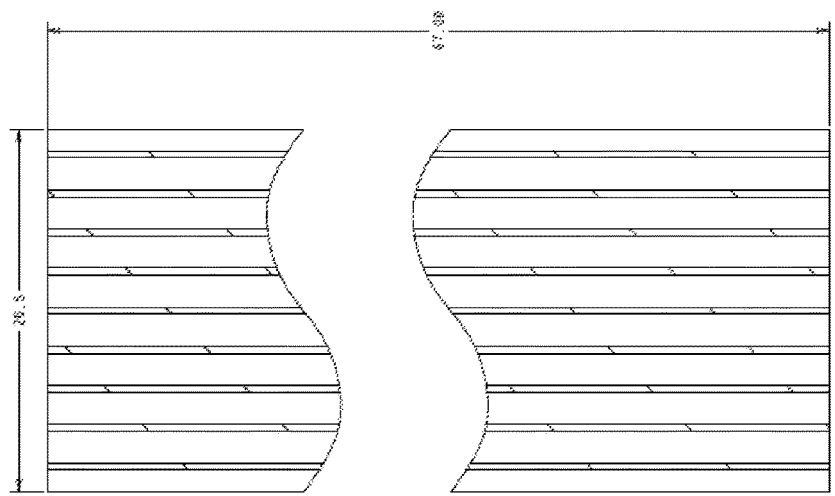
FIGS. 3(d) and 3(e) show the dimensions of the heat sink.
Figure 3E:
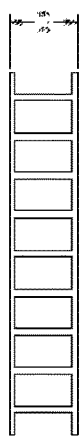

FIG. 3(a) is a perspective view of the heat sink according to the first embodiment of the present disclosure; FIG. 3(b) is a cross sectional view of the heat sink of FIG. 3(a); FIG. 3(c) is a cross sectional view taken along line A-A of the heat sink of FIG. 3(b); and FIGS. 3(d) and 3(e) show the dimensions of the heat sink.

According to the illustrated embodiment, the heat sink 22 may include a top metal sheet 24, a bottom metal sheet 26, and a plurality of slabs 28 extending between the top and bottom sheets 24, 26. The top metal sheet 24 may be spaced apart and disposed parallel to the bottom metal sheet 26. The plurality of slabs 28 may be vertical longitudinal slabs spaced apart from each other. The top metal sheet 24, the bottom metal sheet 26, and the plurality of slabs 28 together define a plurality of air flow channels 30 to facilitate heat dissipation.

FIG. 4(a) is a longitudinal cross section of the enclosed electronic module according to the first embodiment of the present disclosure; and FIG. 4(b) is an enlarged view of the part of the enclosed electronic module in a circle shown in FIG. 4(a).

In the illustrated embodiment, the thermal block 50 can be thermally connected between the heat sink 22 and the active component 12 mounted on an upper surface of the PCB 40 facing the opening 18 of the top housing 14. In addition, a solder pad 60 may be sandwiched between the heat sink 22 and the thermal block 50. The solder pad 60 may be dimensioned to span in between the entire lower surface of the heat sink 22 and the outer surface of top housing 14. Furthermore, a thermal interface material 70 may be sandwiched between the thermal block 50 and the active component 12. The thermal interface material can facilitate thermal interface between the thermal block 50 and the active component 12.

Second Embodiment

FIGS. 5(a) and 5(b) show different views of the enclosed electronic module according to a second embodiment of the present disclosure; FIG. 6(a) is a longitudinal cross section of the enclosed electronic module according to the second embodiment of the present disclosure; and FIG. 6(b) is an enlarged view of the part of the enclosed electronic module in a circle shown in FIG. 6(a).

Similar to the first embodiment, the heat dissipation system of the enclosed electronic module 10 of the second embodiment may include a top housing 14 and a bottom housing 16. The top housing 14 may be coupled to the bottom housing 16 to form an enclosure. A heat sink 22 may be provided on an outer surface of the top housing 14. The heat sink 22 can be attached on the top housing 14 to form a top housing assembly 20. A PCB 40 may be mounted between the top and bottom housings 14, 16.

In this second embodiment, instead of a single active component or heat source, the electronic module 10 can hold multiple active components or heat sources. In the present embodiment, two active components 12 are provided in the electronic module 10. Thus, the top housing 14 may be formed with two openings 18. Two active components 12 may be mounted on an upper surface of the PCB 40 facing the respective two openings 18 of the top housing 14. Two thermal blocks 50 may be thermally connected between the heat sink 22 and the respective two active components 12. In addition, two solder pads 60' may be sandwiched between the heat sink 22 and the respective two thermal blocks 50. As shown in FIG. 6(b), a gap 62 may be formed between the two solder pads 60' to prevent thermal interaction between the two active components 12. Furthermore, two thermal interface materials 70 may be sandwiched between the two thermal blocks 50 and the respective two active components 12.

In the second embodiment, there are two thermal dissipation paths, which extend from the two active components 12 to the heat sink 22 via the two thermal blocks 50. The two thermal dissipation paths are the same as the thermal dissipation path in the first embodiment, i.e. from the upper surface of the active component 12 to the thermal blocks 50 and spread into the heat sink 22. However, the two thermal dissipation paths are not interactive before reaching the heat sink 22. Furthermore, the two solder pads 60' sandwiched between the heat sink 22 and the two thermal blocks 50 are not in the form of a continuous sheet due to the gap 62. Since the gap 62 can prevent the thermal interaction between the two active components 12, it is understood that heat dissipation through two separated solder pads can be faster than a single continuous solder pad.

Moreover, it is contemplated that the two active components 12 may be two different active components that can generate different amounts of heat. Therefore, in order to prevent thermal interaction between the two different active components 12, the thermal block 50 and the solder pad 60' for the two different active components 12 may be made of different materials and have different thermal conductivities in order to correspond the different amounts of heat generated by different active components 12.

Third Embodiment

Figure 7B:
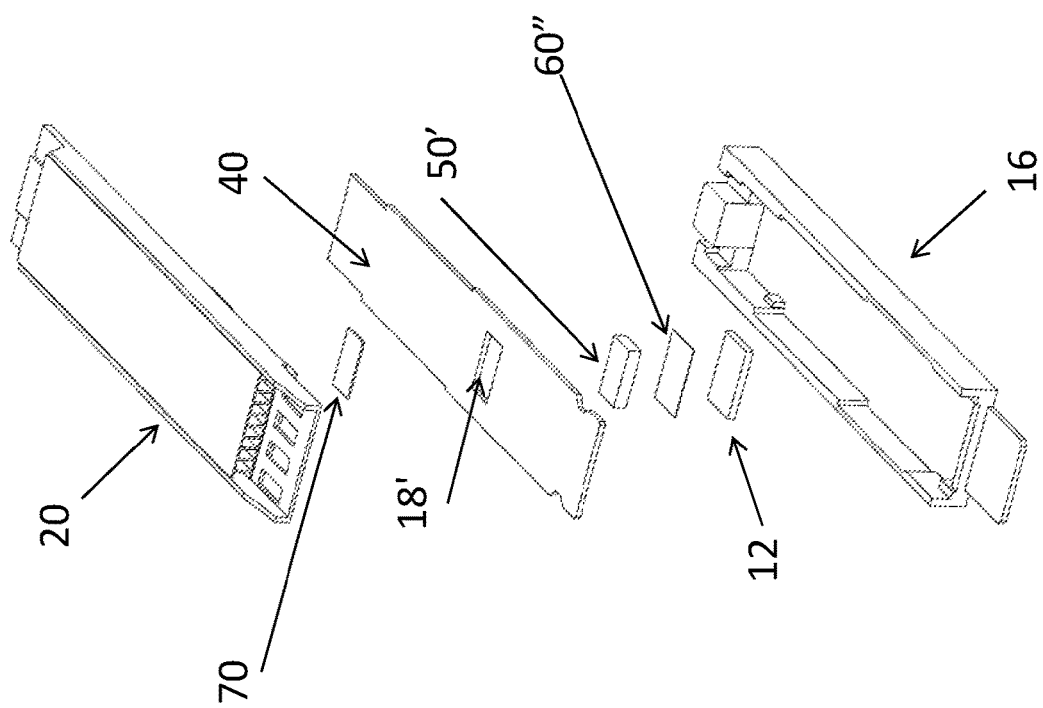
FIG. 7(b) is an exploded view of the enclosed electronic module according to the third embodiment of the present disclosure.
Figure 7A:
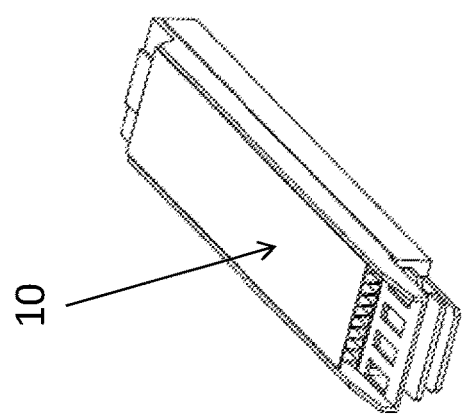
FIG. 7(a) is a perspective view of an enclosed electronic module according to a third embodiment of the present disclosure.

FIGS. 7(a), 7(b) and 7(c) are different views of an enclosed electronic module according to a third embodiment of the present disclosure; FIG. 8(a) is a longitudinal cross section of the enclosed electronic module according to the third embodiment of the present disclosure; and FIG. 8(b) is an enlarged view of the part of the enclosed electronic module in a circle shown in FIG. 8(a).

Similar to the first embodiment, the heat dissipation system of the enclosed electronic module 10 of the third embodiment may include a top housing 14 and a bottom housing 16. The top housing 14 may be coupled to the bottom housing 16 to form an enclosure. A heat sink 22 may be provided on an outer surface of the top housing 14. The heat sink 22 can be attached on the top housing 14 to form a top housing assembly 20. A PCB 40 may be held between the top and bottom housings 14, 16.

In the third embodiment, the PCB 40 may be formed with an additional opening 18', which may be aligned with the opening 18 of the top housing 14. The active component 12 may be mounted under the additional opening 18' on a lower surface of the PCB 40 facing the bottom housing 16. In the present embodiment, the thermal conductive device may include a group of upper and lower thermal blocks 50, 50' thermally connected between the heat sink 22 and the active component 12. The upper thermal block 50 may be disposed within the opening 18 of the top housing 14, and the lower thermal block 50' may be disposed within the additional opening 18' of the PCB 40.

In the illustrated embodiment, an upper solder pad 60 may be sandwiched between the heat sink 22 and the upper thermal block 50. The upper solder pad 60 may be dimensioned to span in between the entire lower surface of the heat sink 22 and the outer surface of top housing 14. Furthermore, a lower solder pad 60" may be sandwiched between the lower thermal block 50' and the active component 12. Finally, a thermal interface material 70 may be sandwiched between the upper and lower thermal blocks 50, 50'.

During manufacturing, the active component 12 can be attached on the lower surface of PCB 40 by a soldering process. The lower thermal block 50' can be inserted into the opening 18' from an upper side of the PCB 40, and can then be attached to the active component 12 by soldering. When the top housing assembly 20 is connected to the bottom housing 16, a thermal dissipation path is established as the upper thermal block 50 on the heat sink 22 is connected to the lower thermal block 50' on active component 12 through the thermal interface material 70. Heat from the active component 12 can be dissipated to the lower thermal block 50', and then to the upper thermal block 50, and finally to the heat sink 22.

Fourth Embodiment

Figure 9C:
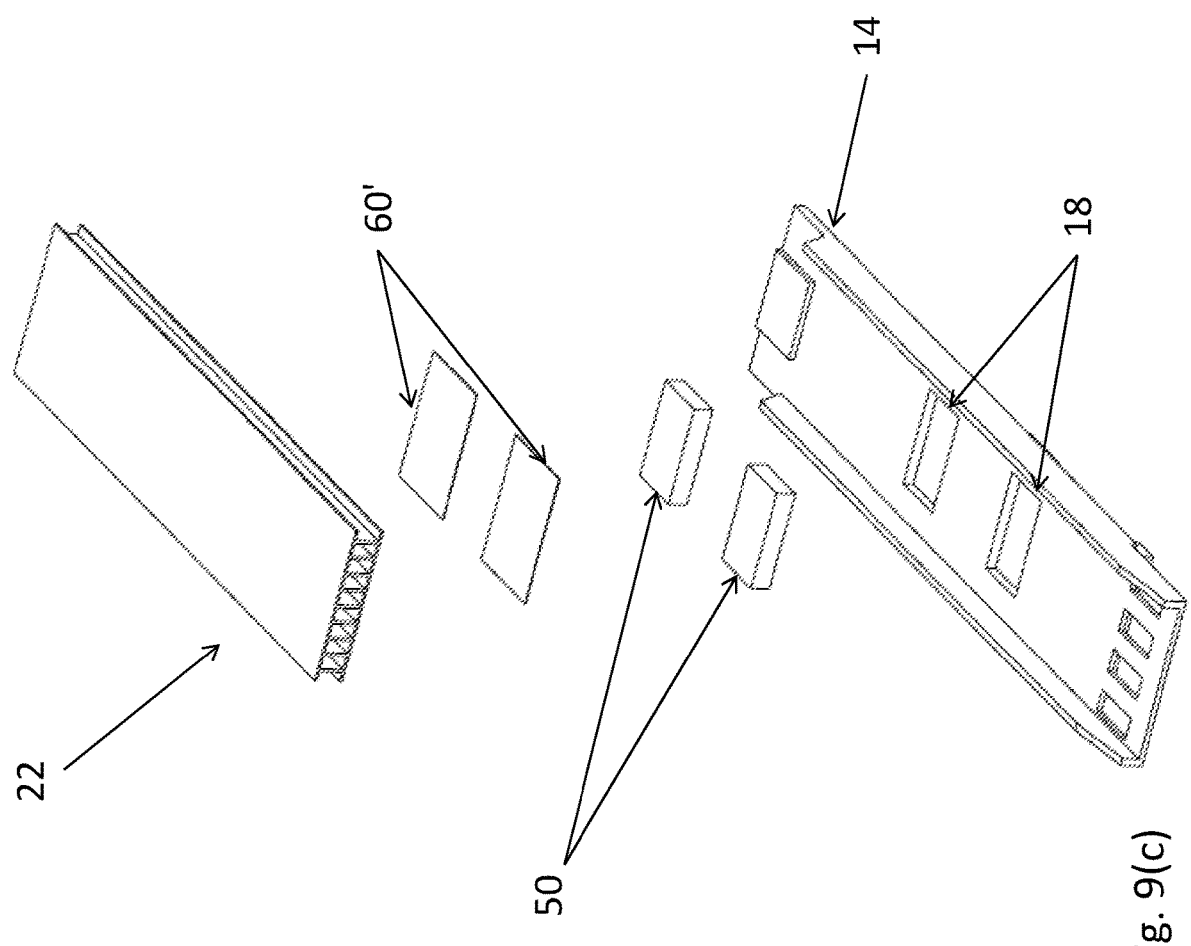
FIG. 9(c) is an exploded view of a top housing assembly according to the fourth embodiment of the present disclosure.

FIGS. 9(*a*), 9(*b*) and 9(*c*) are different views of an enclosed electronic module according to a fourth embodiment of the present disclosure; FIG. 10(*a*) is a longitudinal cross section of the enclosed electronic module according to the fourth embodiment of the present disclosure; and FIG. 10(*b*) is an enlarged view of the part of the enclosed electronic module in a circle shown in FIG. 10(*a*).

Similar to the third embodiment, the heat dissipation system of the enclosed electronic module 10 of the fourth embodiment may include a top housing 14 and a bottom housing 16. The top housing 14 may be coupled to the bottom housing 16 to form an enclosure. A heat sink 22 may be provided on an outer surface of the top housing 14. The heat sink 22 can be attached on the top housing 14 to form a top housing assembly 20. A PCB 40 may be held between the top and bottom housings 14, 16.

In the fourth embodiment, the top housing 14 may be formed with two openings 18. The PCB 40 may be formed with two additional openings 18' aligned with the respective two openings 18 of the top housing 14. Two active components 12 may be mounted respectively under the two additional openings 18' on a lower surface of the PCB 40 facing the bottom housing 16. In the present embodiment, the at least one thermal conductive device may include a first group of upper and lower thermal blocks 50, 50' thermally connected between the heat sink 22 and one of the two active components 12, and a second group of upper and lower thermal blocks 50, 50' thermally connected between the heat sink 22 and another one of the two active components 12. The two upper thermal blocks 50 may be disposed within the respective two openings 18 of the top housing 14, and the two lower thermal blocks 50' may be disposed within the respective two additional openings 18' of the PCB 40.

In the illustrated embodiment, two upper solder pads 60' may be sandwiched between the heat sink 22 and the respective two upper thermal blocks 50. A gap 62' may be formed between the two upper solder pads 60' to prevent thermal interaction between the two active components 12. In additional, two lower solder pads 60" may be sandwiched between the two lower thermal blocks 50' and the respective two active components 12. Finally, two thermal interface materials 70 may be sandwiched between the two upper thermal blocks 50 and the respective two lower thermal blocks 50'.

Fifth Embodiment

FIG. 11(*a*) is a longitudinal cross section of the enclosed electronic module according to a fifth embodiment of the present disclosure; and FIG. 11(*b*) is an enlarged view of the part of the enclosed electronic module in a circle shown in FIG. 11(*a*).

Similar to the first embodiment, the heat dissipation system of the enclosed electronic module 10 of the fifth embodiment may include a top housing 14 and a bottom housing 16. The top housing 14 may be coupled to the bottom housing 16 to form an enclosure. A heat sink 22 may be provided on an outer surface of the top housing 14. The heat sink 22 can be attached on the top housing 14 to form a top housing assembly 20. A PCB 40 may be mounted between the top and bottom housings 14, 16.

In the fifth embodiment, the thermal block 50 is replaced by a vapor chamber 50". The vapor chamber 50" may have liquid in the core with vapor around which is then enclosed by a metal casing. The vapor chamber 50" may be thermally connected between the heat sink 22 and the active component 12 mounted on an upper surface of the PCB 40 facing the top housing 14. Similarly, a solder pad 60 may be sandwiched between the heat sink 22 and the vapor chamber 80. The solder pad 60 may be dimensioned to span an entire lower surface of the heat sink 22. A thermal interface material 70 may be sandwiched between the vapor chamber 50" and the active component 12.

In the present embodiment, a thermal dissipation path can be established in a same way as that described in embodiment 1. By using a vapor chamber, a lower working temperature can be achieved. This can enhance reliability of the product and elongate its lifetime.

Sixth Embodiment

FIG. 12(*a*) is a longitudinal cross section of the enclosed electronic module according to a sixth embodiment of the present disclosure; and FIG. 12(*b*) is an enlarged view of the part of the enclosed electronic module in a circle shown in FIG. 12(*a*).

Similar to the previous embodiments, the heat dissipation system of the enclosed electronic module 10 of the sixth embodiment may include a top housing 14 and a bottom housing 16. The top housing 14 may be coupled to the bottom housing 16 to form an enclosure. A heat sink 22 may be provided on an outer surface of the top housing 14. The heat sink 22 can be attached on the top housing 14 to form a top housing assembly 20. A PCB 40 may be held between the top and bottom housings 14, 16.

In the sixth embodiment, the top housing 14 may be formed with two openings 18. Two active components 12 may be mounted on an upper surface of the PCB 40 facing the respective two openings 18 of the top housing 14. Two vapor chambers 50" may be thermally connected between the heat sink 22 and the respective two active components 12.

In the illustrated embodiment, the two solder pads 60' may be sandwiched between the heat sink 22 and the respective two vapor chambers 80. A gap 62" may be formed between the two solder pads 60' to prevent thermal interaction between the two active components. Finally, two thermal interface materials 70 may be sandwiched between the two vapor chambers 50″ and the respective two active components 12.

In the present embodiment, two thermal dissipation paths can be established in a same way as those described in embodiment 2. By using two vapor chambers, a lower working temperature can be achieved. This can enhance reliability of the product and elongate its lifetime.

Seventh Embodiment

Figure 15A:
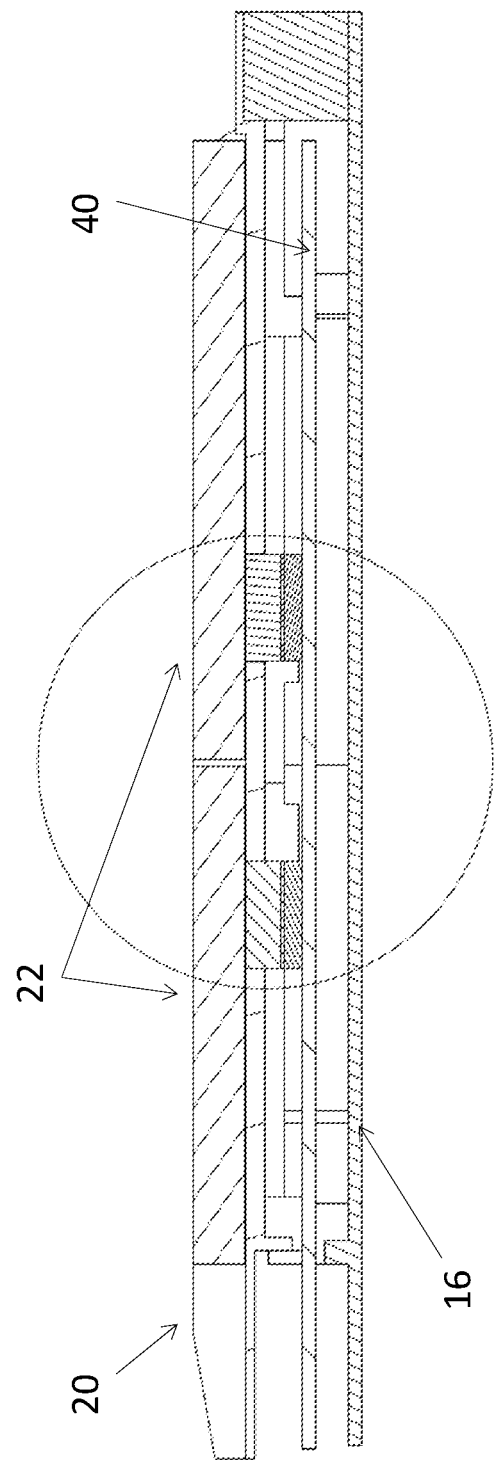
FIG. 15(a) is a longitudinal cross section of the enclosed electronic module according to the seventh embodiment of the present disclosure.
Figure 15B:
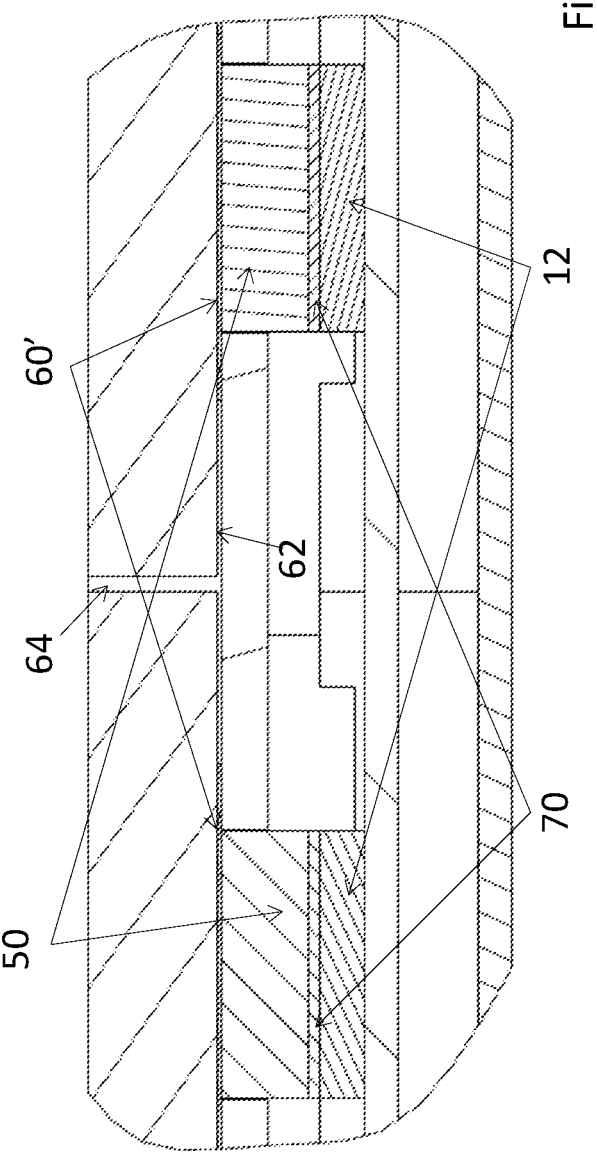
FIG. 15(b) is an enlarged view of the part of the enclosed electronic module in a circle shown in FIG. 15(a).

FIGS. 13(*a*), 13(*b*), 14(*a*) and 14(*b*) are different views of the enclosed electronic module according to a seventh embodiment of the present disclosure; FIG. 15(*a*) is a longitudinal cross section of the enclosed electronic module according to the seventh embodiment of the present disclosure; and FIG. 15(*b*) is an enlarged view of the part of the enclosed electronic module in a circle shown in FIG. 15(*a*).

The structure of the seventh embodiment is similar to that of the second embodiment, except that the heat sink 22 may include two heat sink portions separated by an additional gap 64. The additional gap 64 can further prevent thermal interaction between the two active components 12.

While the heat dissipation system of an enclosed electronic module with single/multiple active components has been shown and described with particular references to a number of preferred embodiments thereof, it should be noted that various other changes or modifications may be made without departing from the scope of the appended claims.

What is claimed is:

1. An enclosed electronic module with single/multiple active components and an integrated heat dissipation system, comprising:
    (a) a top housing formed with at least one opening;
    (b) a heat sink mounted on an outer surface of the top housing over the opening thereof;
    (c) a bottom housing coupled with the top housing;
    (d) at least one active component mounted on a printed circuit board (PCB) mounted between the top and bottom housings; and
    (e) at least one thermal conductive device thermally connected between the heat sink and the active component, one portion of the at least one thermal conductive device being disposed in the opening of the top housing and another portion of the at least one thermal conductive device being disposed outside the opening;
    (f) thereby forming a thermal dissipation path extending from the active component, along the at least one thermal conductive device, through the opening of the top housing and to the heat sink;
    wherein the heat sink is attached on the at least one thermal conductive device by a soldering process, the heat sink with the at least one thermal conductive device is soldered on the outer surface of the top housing to form a top housing assembly, and a thickness of the at least one thermal conductive device is greater than a thickness of the top housing.

2. The enclosed electronic module with single/multiple active components and an integrated heat dissipation system as claimed in claim 1, wherein the at least one thermal conductive device comprises a thermal block thermally connected between the heat sink and the active component mounted on an upper surface of the PCB facing the opening of the top housing.

3. The enclosed electronic module with single/multiple active components and an integrated heat dissipation system as claimed in claim 2, further comprising a solder pad sandwiched between the heat sink and the thermal block, the solder pad being dimensioned to span in between an entire lower surface of the heat sink and the outer surface of the top housing.

4. The enclosed electronic module with single/multiple active components and an integrated heat dissipation system as claimed in claim 2, further comprising a thermal interface material sandwiched between the thermal block and the active component.

5. The enclosed electronic module with single/multiple active components and an integrated heat dissipation system as claimed in claim 1, wherein the top housing is formed with two openings, two active components are mounted on an upper surface of the PCB facing the two openings of the top housing respectively, and the at least one thermal conductive device comprises two thermal blocks thermally connected between the heat sink and the two active components respectively.

6. The enclosed electronic module with single/multiple active components and an integrated heat dissipation system as claimed in claim 5, further comprising two solder pads sandwiched between the heat sink and the respective two thermal blocks, and a gap is formed between the two adjacent solder pads to prevent thermal interaction between the two adjacent active components.

7. The enclosed electronic module with single/multiple active components and an integrated heat dissipation system as claimed in claim 5, further comprising two thermal interface materials sandwiched between the corresponding two thermal blocks and the two active components respectively.

8. The enclosed electronic module with single/multiple active components and an integrated heat dissipation system as claimed in claim 1, wherein the PCB is formed with an additional opening aligned with the opening of the top housing, and the active component is mounted under the additional opening on a lower surface of the PCB facing the bottom housing, and wherein the at least one thermal conductive device comprises a group of upper and lower thermal blocks thermally connected between the heat sink and the active component, the upper thermal block being disposed within the opening of the top housing, and the lower thermal block being disposed within the additional opening of the PCB.

9. The enclosed electronic module with single/multiple active components and an integrated heat dissipation system as claimed in claim 8, further comprising an upper solder pad sandwiched between the heat sink and the upper thermal block, the upper solder pad being dimensioned to span in between an entire lower surface of the heat sink and the outer surface of the top housing; and a lower solder pad sandwiched between the lower thermal block and the active component.

10. The enclosed electronic module with single/multiple active components and an integrated heat dissipation system as claimed in claim 8, further comprising a thermal interface material sandwiched between the upper and lower thermal blocks.

11. The enclosed electronic module with single/multiple active components and an integrated heat dissipation system as claimed in claim 1, wherein the top housing is formed with two openings, the PCB is formed with two additional openings aligned with the two openings of the top housing, and two active components are mounted respectively under the two additional openings on a lower surface of the PCB facing the bottom housing, and wherein the at least one thermal conductive device comprises a first group of upper and lower thermal blocks thermally connected between the heat sink and one of the two active components, and a second group of upper and lower thermal blocks thermally connected between the heat sink and another one of the two active components, the two upper thermal blocks being disposed within the respective two openings of the top housing, and the two lower thermal blocks being disposed within the respective two additional openings of the PCB.

12. The enclosed electronic module with single/multiple active components and an integrated heat dissipation system as claimed in claim 11, further comprising two upper solder pads sandwiched between the heat sink and the respective two upper thermal blocks, a gap being formed between the two adjacent upper solder pads to prevent thermal interaction between the two adjacent active components; and two lower solder pads sandwiched between the two lower thermal blocks and the respective two active components.

13. The enclosed electronic module with single/multiple active components and an integrated heat dissipation system as claimed in claim 11, further comprising two thermal interface materials sandwiched between the two upper thermal blocks and the respective two lower thermal blocks.

14. The enclosed electronic module with single/multiple active components and an integrated heat dissipation system as claimed in claim 1, wherein the at least one thermal conductive device comprises a vapor chamber thermally connected between the heat sink and the active component mounted on an upper surface of the PCB facing the top housing.

15. The enclosed electronic module with single/multiple active components and an integrated heat dissipation system as claimed in claim 14, further comprising a solder pad sandwiched between the heat sink and the vapor chamber, the solder pad being dimensioned to span an entire lower surface of the heat sink and the outer surface of the top housing.

16. The enclosed electronic module with single/multiple active components and an integrated heat dissipation system as claimed in claim 14, further comprising a thermal interface material sandwiched between the vapor chamber and the active component.

17. The enclosed electronic module with single/multiple active components and an integrated heat dissipation system as claimed in claim 1, wherein the top housing is formed with two openings, and two active components are mounted on an upper surface of the PCB facing the respective two openings of the top housing, and wherein the at least one thermal conductive device comprises two vapor chambers thermally connected between the heat sink and the respective two active components.

18. The enclosed electronic module with single/multiple active components and an integrated heat dissipation system as claimed in claim 17, further comprising two solder pads sandwiched between the heat sink and the respective two vapor chambers, a gap being formed between the two adjacent solder pads to prevent thermal interaction between the two adjacent active components.

19. The enclosed electronic module with single/multiple active components and an integrated heat dissipation system as claimed in claim 17, further comprising two thermal interface materials sandwiched between the two vapor chambers and the two active components respectively.

20. The enclosed electronic module with single/multiple active components and an integrated heat dissipation system as claimed in claim 6, wherein the heat sink comprises two heat sink portions separated by an additional gap to further prevent thermal interaction between the two adjacent active components.

21. The enclosed electronic module with single/multiple active components and an integrated heat dissipation system as claimed in claim 1, wherein the heat sink comprises a top metal sheet; a bottom metal sheet; and a plurality of slabs extending between the top and bottom sheets, and defining therein between a plurality of air flow channels to facilitate heat dissipation.

22. The enclosed electronic module with single/multiple active components and an integrated heat dissipation system as claimed in claim 6, wherein the two active components are different active components that generate different amounts of heat, and the thermal blocks and the solder pads for the two different active components are made of different materials and have different thermal conductivities to prevent thermal interaction between the two active components.

* * * * *